(12) United States Patent
Patel

(10) Patent No.: US 11,561,797 B2
(45) Date of Patent: Jan. 24, 2023

(54) DECOMPRESSION ENGINE FOR DECOMPRESSING COMPRESSED INPUT DATA THAT INCLUDES MULTIPLE STREAMS OF DATA

(71) Applicant: ATI Technologies ULC, Markham (CA)

(72) Inventor: Vinay Patel, Stouffville (CA)

(73) Assignee: ATI Technologies ULC, Markham (CA)

( * ) Notice: Subject to any disclaimer, the term of this patent is extended or adjusted under 35 U.S.C. 154(b) by 584 days.

(21) Appl. No.: 16/544,594

(22) Filed: Aug. 19, 2019

(65) Prior Publication Data

US 2021/0055932 A1 Feb. 25, 2021

(51) Int. Cl.
*H03M 7/34* (2006.01)
*G06F 9/38* (2018.01)
*H03M 7/30* (2006.01)
*H03M 7/40* (2006.01)

(52) U.S. Cl.
CPC .......... *G06F 9/3822* (2013.01); *G06F 9/3851* (2013.01); *H03M 7/3059* (2013.01); *H03M 7/4037* (2013.01); *H03M 7/6005* (2013.01)

(58) Field of Classification Search
CPC ........ H03M 7/30; H03M 7/40; H03M 7/4006; H03M 7/3086; H03M 7/3088; H03M 7/3059; H03M 7/3084; H03M 7/6005; H03M 7/6023; H03M 7/42; H03M 7/425; H03M 7/48; H03M 13/1102; H03M 13/3761; H03M 7/4031; H03M 7/4037; H03M 7/4056; H03M 7/4081; H03M 7/46; H03M 7/60; H03M 7/6011; H03M 7/6017; H03M 7/6047; H03M 7/607
USPC .......................................... 341/51, 106, 107
See application file for complete search history.

(56) References Cited

U.S. PATENT DOCUMENTS

| | | | | |
|---|---|---|---|---|
| 5,091,955 A | * | 2/1992 | Iseda | ...................... H03M 3/042 |
| | | | | 704/E19.041 |
| 5,654,703 A | * | 8/1997 | Clark, II | ............. H03M 7/3084 |
| | | | | 375/E7.231 |
| 6,459,429 B1 | * | 10/2002 | Deering | ................. G06T 17/20 |
| | | | | 345/423 |

(Continued)

*Primary Examiner* — Linh V Nguyen
(74) *Attorney, Agent, or Firm* — Park, Vaughan, Fleming & Dowler LLP

(57) ABSTRACT

An electronic device that includes a decompression engine that includes N decoders and a decompressor decompresses compressed input data that includes N streams of data. Upon receiving a command to decompress compressed input data, the decompression engine causes each of the N decoders to decode a respective one of the N streams from the compressed input data separately and substantially in parallel with others of the N decoders. Each decoder outputs a stream of decoded data of a respective type for generating commands associated with a compression standard for decompressing the compressed input data. The decompressor next generates, from the streams of decoded data output by the N decoders, commands for decompressing the data using the compression standard to recreate the original data. The decompressor next executes the commands to recreate the original data and stores the original data in a memory or provides the original data to another entity.

23 Claims, 5 Drawing Sheets

(56) References Cited

U.S. PATENT DOCUMENTS

| | | | | |
|---|---|---|---|---|
| 6,862,278 B1* | 3/2005 | Chang | ............... | H04N 19/176 |
| | | | | 370/506 |
| 7,496,589 B1* | 2/2009 | Jain | ............... | G06F 16/221 |
| | | | | 708/203 |
| 7,573,951 B2* | 8/2009 | Kim | ............... | H04N 19/436 |
| | | | | 375/240.03 |
| 8,125,357 B1* | 2/2012 | Hamlet | ............... | H03M 7/4043 |
| | | | | 341/51 |
| 9,252,805 B1* | 2/2016 | Abali | ............... | H03M 7/6005 |
| 9,484,954 B1* | 11/2016 | Gopal | ............... | H03M 7/3086 |
| 9,819,359 B1* | 11/2017 | Havlik | ............... | H03M 7/6023 |
| 9,859,918 B1* | 1/2018 | Gopal | ............... | G06F 3/0664 |
| 2013/0033389 A1* | 2/2013 | Bendel | ............... | H03M 7/30 |
| | | | | 341/50 |
| 2020/0034709 A1* | 1/2020 | Rippel | ............... | G06N 3/084 |

\* cited by examiner

DECOMPRESSION ENGINE FOR DECOMPRESSING COMPRESSED INPUT DATA THAT INCLUDES MULTIPLE STREAMS OF DATA

BACKGROUND

Related Art

Some electronic devices perform operations for compressing data such as user or system files, flows or sequences of data, etc. For example, electronic devices may compress data to reduce the size of the data to enable more efficient storage of the data in memories, transmission of the data between electronic devices via a network, etc. Many of these electronic devices use a compression standard such as a Lempel-Ziv 77-(LZ77-) or LZ78-based compression standard and/or an encoding standard such as Huffman coding to generate compressed data from original data.

Although compressing data can reduce the effort and energy involved in storing and handling data, compressed data must be decompressed before being used for many operations. This means that, before such operations can be performed, an electronic device must perform operations to reverse the effects of the operations of the compression standard and/or encoding standard, and thus to restore the original data. In many electronic devices, data is decompressed in software (i.e., using a software routine or application program), which typically requires a general-purpose processor to perform a large number of computational operations and corresponding memory accesses for decompressing compressed data. Due to the large number of computational operations and the memory accesses, decompressing data in software is inefficient.

BRIEF DESCRIPTION OF THE FIGURES

Throughout the figures and the description, like reference numerals refer to the same figure elements.

DETAILED DESCRIPTION

Figure 1:
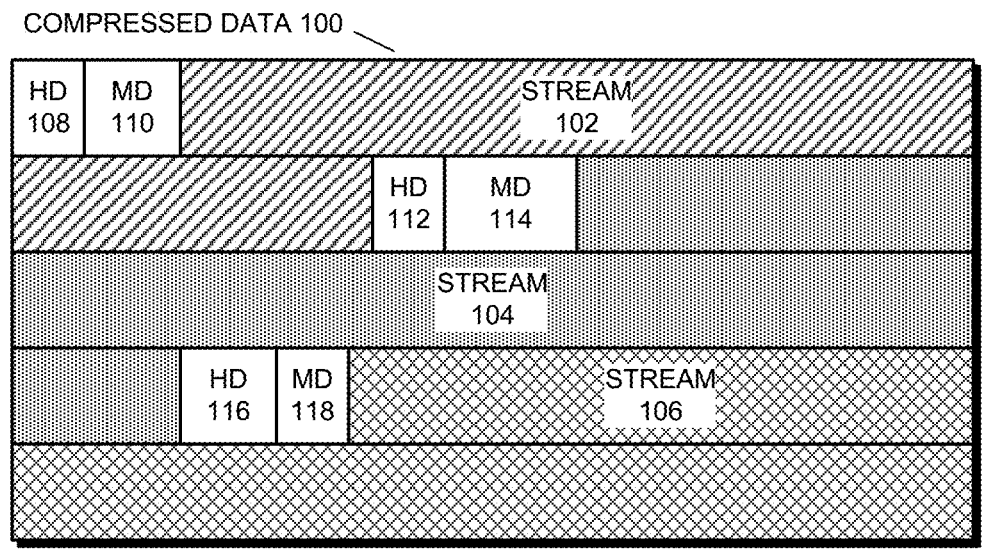
FIG. 1 presents a block diagram illustrating compressed data that includes streams of data in accordance with some embodiments.

The following description is presented to enable any person skilled in the art to make and use the described embodiments and is provided in the context of a particular application and its requirements. Various modifications to the described embodiments will be readily apparent to those skilled in the art, and the general principles defined herein may be applied to other embodiments and applications. Thus, the described embodiments are not limited to the embodiments shown, but are to be accorded the widest scope consistent with the principles and features disclosed herein.

Terminology

In the following description, various terms are used for describing embodiments. The following is a simplified and general description of one of these terms. Note that this term may have significant additional aspects that are not recited herein for clarity and brevity and thus the description is not intended to limit the term.

Functional block: functional block refers to a group, collection, and/or set of one or more interrelated circuit elements such as integrated circuit elements, discrete circuit elements, etc. The circuit elements are "interrelated" in that circuit elements share at least one property. For example, the interrelated circuit elements may be included in, fabricated on, or otherwise coupled to a particular integrated circuit chip or portion thereof, may be involved in the performance of given functions (computational or processing functions, memory functions, etc.), may be controlled by a common control element and/or a common clock, etc. A functional block can include any number of circuit elements, from a single circuit element (e.g., a single integrated circuit logic gate) to millions or billions of circuit elements (e.g., an integrated circuit memory).

Compressed Data

In the described embodiments, operations are performed on and using compressed data. Generally, compressed data is the output of one or more compression, encoding, and/or other operations on original data that result in at least some of the original data being replaced by data that can be used to recreate the original data (for lossless compression), by data that approximates the original data (for lossy compression), and/or by other values. In the described embodiments, various types of data may be compressed, including user or system files (e.g., audio and/or video files, text files, documents, executable files, operating system files, spreadsheets, etc.), flows or sequences of data (e.g., audio and/or video data flows, sequences of data received via a network interface, etc.), data captured from sensors (e.g., cameras and/or microphones, thermometers, vibration sensors, etc.), etc. In the described embodiments, numerous compression, encoding, and/or other operational standards, algorithms, or formats, or combinations thereof, can be used for compressing data, including prefix coding standards, dictionary coding compression standards, delta encoding, autoregressive model compression, etc.

The terms "compressed data" and "compression" as used herein apply broadly to operations on original data that result in at least some of the original data being replaced by other data that can be used to wholly or approximately recreate the original data. As described above, these operations include various compression, encoding, and/or other operational standards, algorithms, or formats, or combinations thereof. These terms should therefore not be interpreted as being limited only to operations such as dictionary coding compression and/or other operations that may sometimes be regarded as "compression" operations.

In some embodiments, when compressing data, an electronic device creates compressed data that includes N separate streams of data, where N is greater than or equal to one. The N streams of data are blocks or portions of the compressed data that are independent of one another and include types of data that can, for example, be decoded in a decoder during a decompression operation and then used for generating commands associated with the compression standard for decompressing the compressed input data. In some embodiments, each stream is self-contained, in that each stream can be decoded without referring to data outside of that stream's data. FIG. 1 presents a block diagram illustrating compressed data that includes streams of data in accordance with some embodiments. As can be seen in FIG. 1, compressed data 100, which can be or include a file, a flow or sequence of data, etc., includes three streams of data, streams 102-106, each of which is marked in FIG. 1 using a different fill pattern (i.e., diagonal fill for stream 102, etc.). Each stream of data includes a number of bytes or blocks of data of a respective type. For example, assuming that compressed data 100 was compressed using a dictionary coding compression standard, each stream includes elements of the dictionary coding compression standard that are to be used for generating commands associated with the dictionary coding compression standard for decompressing the compressed input data such as literals, command tags, distances, lengths, and/or other values. For this example, literals are strings that have not been detected as duplicated within specified number of bytes of original data (i.e., the data being compressed), commands tags are values that identify specified commands for performing decompression operations (e.g., add/append one or more literals to recreated original data, etc.), and lengths and distances are used to indicate duplicated strings to be added/appended to recreated to original data. For instance, stream 102 may include (and possibly only include) literals, stream 104 may include (and possibly only include) command tags, and stream 106 may include (and possibly only include) distances or lengths.

In some embodiments, each stream of data in FIG. 1 starts with a header, i.e., header (HD) 108, 112, and 116, respectively, which includes information describing the content, formatting, source electronic device, routing values, and/or length of the stream, etc. In some embodiments, each stream of data includes metadata, i.e., metadata (MD) 110, 114, and 118, respectively, which is or includes information such as a decoding reference for decoding the respective stream from the compressed data, information about the stream from the compressed data, etc. The header and metadata for each stream are followed by the body of the stream, which includes the compressed data of the respective type. Each of stream 102, 104, and 106 starts at a given location in the compressed data, e.g., at a given byte, frame, or block, and, aside from stream 102, follows a preceding stream. For example, header 108 for stream 102 can be located at byte 0 of the compressed data (e.g., at a starting address in memory, a first location in the overall flow or sequence of data, etc.) and the combination of header 108, metadata 110, and stream 102 may be 50 kB long, and so header 112 for stream 104 may be located at 50 kB, and so forth. The streams in FIG. 1 span lines in FIG. 1, so stream 102 includes a portion in a first line of compressed data 100 and a portion in the second line of compressed data 100; this is simply for illustration. As described above, the streams are sequences of data such as bytes or blocks retrieved from a file, from a flow or sequence of data that is received via a network interface, etc.

In some embodiments, an electronic device generates, from original data, compressed data (e.g., compressed data 100) by first compressing the original data using a compression standard. For example, in some embodiments, the electronic device uses a dictionary coding compression standard such as an LZ77- or LZ78-based compression standard for compressing the original data to generate the compressed data. During or subsequent to the compressing operation, the electronic device separates the compressed data into N streams (e.g., streams 102-106), each of the N streams including a respective type of data for generating commands associated with the compression standard for decompressing the compressed input data, along with a header and possibly metadata. For example, in some embodiments, for the above-described LZ77- or LZ78-based compression standards, the types of data include some or all of literals, command tags, distances, and lengths, and thus the individual streams can include—and possibly only include—the literals, command tags, distances, and lengths. The electronic device next encodes each of the N streams using an encoding standard to further compress each stream. For example, in some embodiments, the electronic device uses a prefix coding standard such as Huffman coding for encoding the streams.

Although a particular sequence of compression and encoding is described as being used to create compressed data and a specific instance of compressed data is shown in FIG. 1, the described embodiments are not limited to the sequence and/or the instance of compressed data. Generally, any combination of compression and/or encoding can be used for creating any version of compressed data from original data, as long as the compressed data can be decompressed in a decompression engine as described herein.

Overview

In the described embodiments, an electronic device performs operations for decompressing compressed data that includes N streams of data. The electronic device includes a hardware decompression engine that has N decoders and a decompressor. In other words, the decompression engine, which is a functional block itself, includes functional blocks for the N decoders and the decompressor. The N decoders and the decompressor in the hardware decompression engine are used for decompressing the compressed data that includes the N streams of data.

In some embodiments, when decompressing compressed data that includes the N streams of data, the decompression engine first receives a command or a request. The command or request identifies the compressed data (e.g., identifies a starting address in memory of the compressed data, a location where a flow or sequence of the compressed data can be acquired, etc.) and requests decompression of the compressed data. The command or request may also identify configurations and settings used for compressing the data that are used by the decompression engine when decompressing the compressed data. The command or request may further include or identify certain values, such as initial decompression data or other values that are used by the decompression engine when decompressing the compressed data.

Upon receiving the command or request, the decompression engine causes each one of the N decoders to separately decode a respective one of the N streams of data substantially in parallel using a coding standard (e.g., a prefix coding standard and/or another coding standard). For the decoding operation, the decompression engine communicates a location of a first stream to a stream header decoder in a first of the N decoders (i.e., the one of the N decoders that is selected to decode the first stream). The stream header decoder decodes a header in the first stream, determines a length of the first stream, communicates the length back to the decompression engine, and the first of the N decoders proceeds with decoding the first stream. The decompression engine uses the length to determine a starting location in the compressed data of the second stream and communicates the location of the second stream to a stream header decoder in a second of the N decoders, which proceeds as did the stream header decoder in the first decoder. The decompression engine proceeds in this way for the remaining decoders, determining the starting location of the respective stream and starting the decoding for each of the decoders. As used herein, therefore, "substantially in parallel" means that the N decoders decode respective streams at approximately the same time, as offset by the overhead for starting decoding in each of the N decoders, etc. Note that, in some embodiments, unlike the header-per-stream example above, a header of a first stream of the N streams (or a header of the compressed data generally) includes length and/or starting location information for all N streams. In these embodiments, the decompression engine acquires the lengths and/or starting location information for all of the streams from the header of the first stream (or the header of the compressed data) and may start all remaining decoders (or all decoders) at approximately the same time using the respective length and/or starting location information acquired from the header of the first stream (or the header of the compressed data).

Recall that each of the N streams of data includes a respective type of data for generating commands associated with the compression standard for decompressing the compressed input data, and thus the output from each of the N decoders is a stream of decoded data of the respective type. For example, in an embodiment where the compression standard used for compressing the data is a dictionary coding compression standard, the types of data can include literals, command tags, distances, lengths, and/or other types of data. For this example, in some embodiments, one or more of the N streams includes literals, one or more of the N streams includes command tags, etc. In some embodiments, streams include only one particular type of data—and not a mixture of types of data.

In some embodiments, at least one of the decoders generates, creates, and/or initializes a decoding reference (e.g., one or more tables, lists, and/or other records) that is used by that decoder for the decoding operation. For example, in some embodiments, a given decoder acquires, from a specified location in the stream that is to be decoded by the given decoder (e.g., from metadata bytes in the stream immediately following a header of the stream, etc.), information for generating the decoding reference. For instance, in an embodiment where the given decoder uses Huffman coding to decode the stream, the given decoder may acquire information for initializing/filling in a decoding table that includes mappings between Huffman codes and symbols (e.g., patterns of bits or bytes) to be used for the decoding operation.

In some embodiments, some or all of the decoders include substream decoders. Each of the substream decoders in a decoder is a different decoding functional block that can be used by the decoder for decoding separate portions of the data from the stream being decoded. For example, in an embodiment where a decoder has M substream decoders, each of the M substream decoders acquires a respective next chunk of data, symbol, etc. from the stream in a round-robin manner and decodes that chunk of data, symbol, etc. In some of these embodiments, the M sub stream decoders each decode a next chunk of data, encoded symbol, etc. substantially in parallel. For example, in some embodiments, in a given cycle of a controlling clock, time period, etc., each of the M sub stream decoders decodes at least one chunk of data, symbol, etc., so that all of the M substream decoders produce one or more decoded symbols or other pieces of decoded data for each cycle of the controlling clock. In some embodiments, a stream combiner combines the output from the substream decoders for forwarding to the decompressor.

After decoding the data for each of the N streams, the N decoders forward streams of decoded data of the respective types of data to the decompressor in the decompression engine. From the streams of decoded data output by the N decoders, the decompressor generates commands for decompressing the data using the compression standard to recreate the original data. For this operation, the decompressor acquires data from some or all of the streams for generating each command and then generates the command from the data. Continuing the example above, in some embodiments, for each command, the decompressor acquires some or all of a next literal, command tag, distance, length, and/or other type of data from the respective stream and assembles a command therefrom. At the conclusion of this operation, the decompressor has a single command that will, when executed, cause the decompressor to acquire and/or generate a next block of data (e.g., a P-byte block of data) for recreating the original data.

In some embodiments, the decompressor includes an operational combiner that performs operations for combining groups of two or more commands into aggregate commands. In these embodiments, as commands are generated in the decompressor, two or more commands are buffered (i.e., temporarily stored) and then an attempt is made to combine the two or more commands into an aggregate command. For example, commands that access the neighboring memory locations, the same cache lines, etc. may be combined into an aggregate command. By combining the commands, operations for and associated with executing the commands (e.g., memory accesses, etc.) can be performed more efficiently.

The decompressor next executes the commands to recreate the original data. For this operation, an execution functional block in the decompressor executes the commands, which causes the execution functional block to generate and/or acquire the next block of data for recreating the original data. For example, and continuing the dictionary coding compression standard example from above, a command may cause the execution functional block to acquire a next one or more literals and add/append the next literal to the recreation of the original data (i.e., to an output file or stream being generated by the decompressor). As another example, and again continuing the dictionary coding compression standard example, the command may cause the execution functional block to read a prior value having a specified length from an identified location in the already-recreated original data (i.e., from data that was earlier output by the execution functional block) and add/append that prior value to the recreation of the original data.

In some embodiments, the decompressor includes a read manager functional block that fetches data for executing commands from memory prior to the commands being executed in the execution functional block. In some of these embodiments, commands are buffered to await the return of data from memory—and are executed when the data is returned. In some embodiments, the decompressor includes a history buffer, which is a first-in-first-out (FIFO) buffer in which a specified number of literals and/or prior values are stored and fed back to dependent subsequent commands. In these embodiments, the literals and/or prior values are eventually read from the FIFO buffer and appended to the recreation of the original data, i.e., stored as decompressed data in memory, output as a flow or sequence of decompressed data, etc.

By using the hardware decompression engine with the N decoders and the decompressor for decompressing compressed data that includes N streams of data, the described embodiments perform operations in hardware that existing devices perform using software. The hardware decompression engine is faster and more efficient (e.g., requires less memory accesses, uses less electrical power, etc.) than using a software entity for performing the same operations. In addition, using the decompression engine frees other functional blocks in the electronic device (e.g., processing subsystems, etc.) for performing other operations. The decompression engine therefore improves the overall performance of the electronic device, which in turn improves user satisfaction.

Electronic Device

Figure 2:
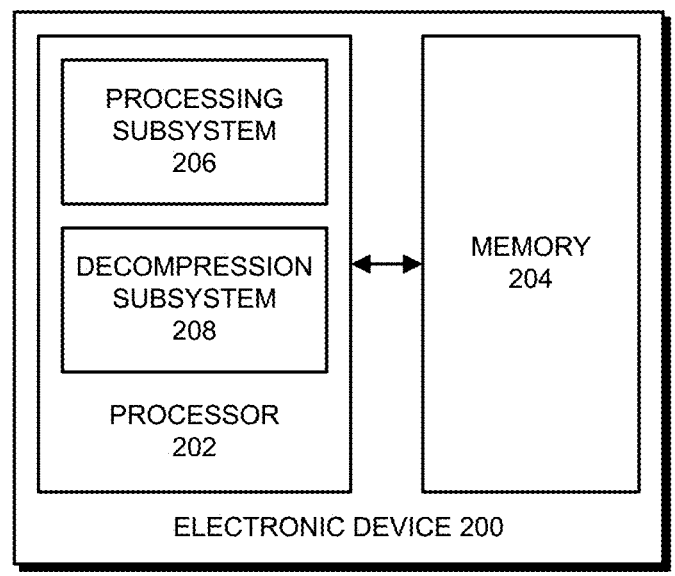
FIG. 2 presents a block diagram illustrating an electronic device in accordance with some embodiments.

FIG. 2 presents a block diagram illustrating electronic device 200 in accordance with some embodiments. As can be seen in FIG. 2, electronic device 200 includes processor 202 and memory 204. Processor 202 is a functional block that performs computational, decompression, and other operations in electronic device 200. Processor 202 includes processing subsystem 206 and decompression subsystem 208. Processing subsystem 206 includes one or more functional blocks such as central processing unit (CPU) cores, graphics processing unit (GPU) cores, embedded processors, and/or application specific integrated circuits (ASICs) that perform general purpose computational, decompression, and other operations.

Decompression subsystem 208 is a functional block that performs operations for decompressing compressed input data that includes separate streams of data. Generally, decompression subsystem 208 takes, as input, a command or request to decompress specified compressed input data such as a file, flow or sequence of data, etc., and returns uncompressed data that wholly or approximately recreates the original data from which the compressed input data was generated. Decompression subsystem 208 is described in more detail below.

Memory 204 is a functional block that performs operations of a memory (e.g., a main memory) in electronic device 200. Memory 204 includes memory circuits (i.e., storage elements, access elements, etc.) for storing data and instructions for use by functional blocks in electronic device 200, as well as control circuits for handling accesses (e.g., reads, writes, checks, deletes, invalidates, etc.) of data and instructions in the memory circuits. The memory circuits in memory 204 include computer-readable memory circuits such as fourth-generation double data rate synchronous dynamic random access memory (DDR4 SDRAM), static random access memory (SRAM), or a combination thereof.

Electronic device 200 is shown using particular numbers and arrangements of elements (e.g., functional blocks and devices such as processor 202, memory 204, etc.). Electronic device 200, however, is simplified for illustrative purposes. In some embodiments, a different number or arrangement of elements is present in electronic device 200. For example, electronic device 200 may include power subsystems, displays, etc. Generally, electronic device 200 includes sufficient elements to perform the operations herein described.

Although decompression subsystem 208 is shown in FIG. 2 as being included in processor 202, in some embodiments, decompression subsystem 208 is a separate and/or standalone functional block. For example, decompression subsystem 208 might be implemented (by itself or with supporting circuit elements and functional blocks) on a standalone integrated circuit chip, etc. Generally, in the described embodiments, decompression subsystem 208 is suitably situated in electronic device 200 to enable performing the operations herein described.

Electronic device 200 can be, or can be included in, any electronic device that performs data decompression or other operations. For example, electronic device 200 can be, or can be included in, electronic devices such as desktop computers, laptop computers, wearable electronic devices, tablet computers, smart phones, servers, artificial intelligence apparatuses, virtual or augmented reality equipment, network appliances, toys, audio-visual equipment, home appliances, controllers, vehicles, etc., and/or combinations thereof.

Decompression Engine

Figure 3:
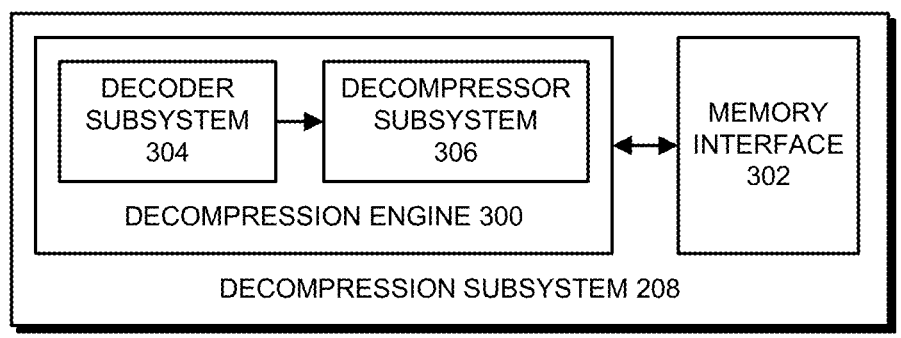
FIG. 3 presents a block diagram illustrating a decompression subsystem in accordance with some embodiments.

In the described embodiments, a decompression subsystem in an electronic device performs operations for decompressing compressed input data. FIG. 3 presents a block diagram illustrating decompression subsystem 208 in accordance with some embodiments. As can be seen in FIG. 3, decompression subsystem 208 includes decompression engine 300 and memory interface 302. Decompression engine 300 is a functional block that performs operations for and associated with decompressing compressed input data. Decompression engine 300 includes decoder subsystem 304 and decompressor subsystem 306, which are functional blocks that each perform a respective part of the operations for and associated with decoding encoded data and decompressing compressed data. Decoder subsystem 304 and decompressor subsystem 306 are described in more detail below.

Memory interface 302 is a functional block that performs operations for and associated with memory accesses (e.g., memory reads, writes, invalidations, deletions, etc.) by decompression engine 300. For example, in some embodiments, original data that is recreated from compressed input data is stored in a memory (e.g., memory 204) via memory interface 302. As another example, in some embodiments, compressed input data is retrieved or acquired from a memory via memory interface 302 in preparation for decompressing the compressed input data. Although a memory interface 302 is shown in FIG. 3, in some embodiments, decompression subsystem 208 includes and uses one or more additional or different interfaces, such as a network interface, an IO device interface, an inter-processor communication interface, etc. Generally, in the described embodiments, decompression subsystem 208 includes one or more functional blocks or devices for retrieving compressed input data, for writing out recreated original data, and/or for exchanging communications (e.g., commands, etc.) with other functional blocks in an electronic device in which decompression subsystem 208 is located (e.g., electronic device 200).

Figure 4:
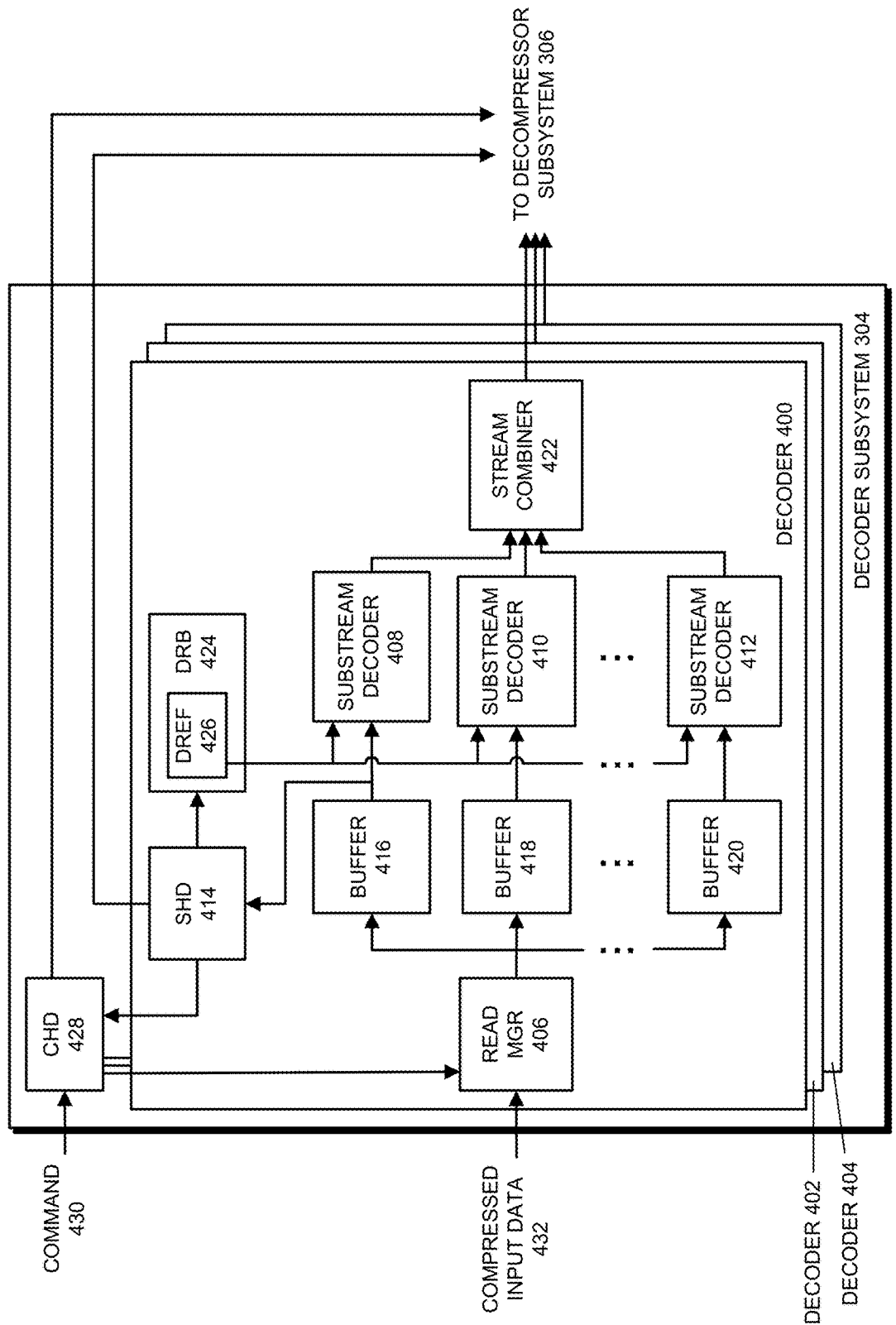
FIG. 4 presents a block diagram illustrating a decoder subsystem in accordance with some embodiments.
Figure 5:
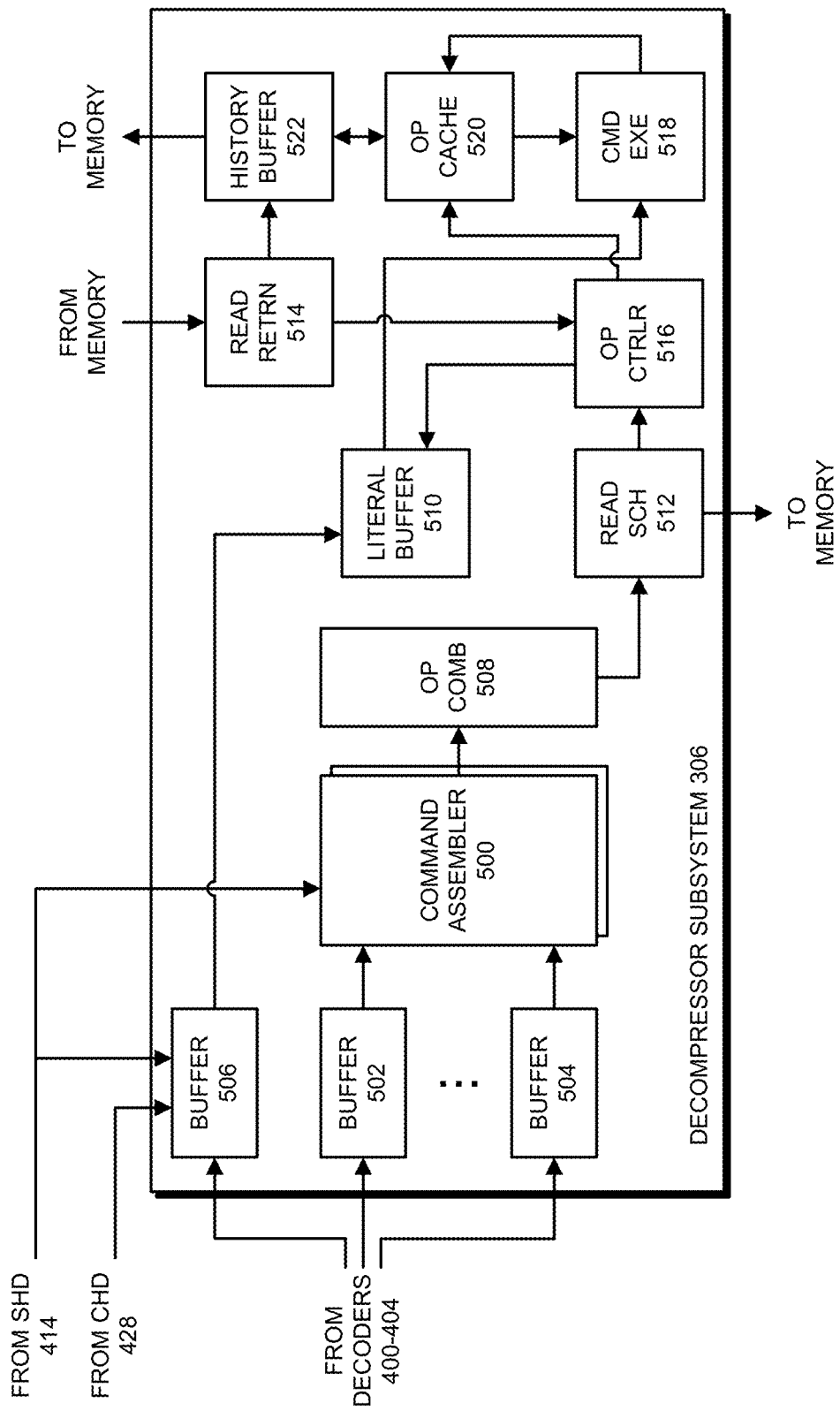
FIG. 5 presents a block diagram illustrating a decompressor subsystem in accordance with some embodiments.

Note that, for the following discussion of the examples in FIGS. 3-5, it is assumed that compressed input data is acquired from memory (e.g., memory 204) for decompression and that the original data recreated from the compressed input data is stored in memory 204. This is not a requirement. In some embodiments, the compressed data is acquired from other sources and/or stored in or provided to other destinations in electronic device 200 and beyond (e.g., via a network interface, IO device, etc.). In addition, for the examples in FIGS. 3-5, it is assumed that original data was processed as described above for generating compressed input data, i.e., was first compressed using a dictionary coding compression standard (e.g., an LZ77- or LZ78-based standard), then separated into N streams by data type for the dictionary coding compression standard (e.g., literals, command tags, distances, lengths, etc.), and finally the individual streams separately encoded using a prefix coding standard (e.g., Huffman coding). This is also not a requirement. In some embodiments, different compression, encoding, and/or other operational standards, algorithms, or formats, or combinations thereof can be used for generating the compressed input data—and are decompressed and/or otherwise reversed using operations similar to those described for FIGS. 3-5.

FIG. 4 presents a block diagram illustrating decoder subsystem 304 in accordance with some embodiments. Decoder subsystem 304 includes a number of separate decoders 400-404. Each of decoders 400-404 performs operations for decoding data of a given type for generating commands associated with the compression standard for decompressing the compressed input data, e.g., literals, command tags, distances, etc. In some embodiments, each decoder 400-404 is dedicated to decoding data of the given type, such as by including circuit elements in that decoder that are designed for decoding data of the given type. In some embodiments, each of decoders 402-404 includes internal elements (which are not shown for clarity) similar to those shown in decoder 400, although this is not a requirement. Generally, each decoder includes sufficient internal elements to decode data of one or more types.

As can be seen in FIG. 4, decoder 400 includes read manager 406, which is a functional block that performs operations associated with acquiring compressed input data 432 from memory and directing portions of compressed input data 432 to substream decoders 408-412. Substream decoders 408-412 are each a functional block that decodes and otherwise processes respective portions of streams being decoded in decoder 400. Decoder 400 further includes stream header decoder (SHD) 414, which is a functional block that performs operations for processing information from headers of streams being decoded in decoder 400. Decoder 400 further includes buffers 416-420, which are functional blocks that perform operations for buffering (i.e., temporarily storing) portions of streams being decoded in decoder 400 and providing the portions of the streams to a corresponding substream decoder (e.g., buffer 416 provides portions of streams to substream decoder 408, etc.). Decoder 400 further includes a stream combiner 422, which is a functional block that performs operations for combining individual decoded data portions output from substream decoders 408-412 into a single stream of decoded data to be output from decoder 400 to decompressor subsystem 306. Decoder 400 further includes decoding reference builder (DRB) 424, which is a functional block that performs operations for initializing and filling in decoding reference (DREF) 426 from which information is acquired and used by substream decoders 408-412 for decoding portions of streams.

During operation of decoder subsystem 304, a command header decoder (CHD) 428 receives a command 430 (which can be or be included in a message, packet, request, and/or other form of communication) that identifies and requests the decompression of compressed input data 432. For example, in some embodiments, command 430 identifies compressed input data 432 via an absolute or relative address, a location, and/or a reference in memory where compressed input data 432 is stored. In some embodiments, command 430 also includes information identifying configurations and settings used for compressing compressed input data 432, the information identifying the configurations and settings to be used by decoder subsystem 304 and/or decompressor subsystem 306 for decoding and/or decompressing compressed input data 432. For example, in some embodiments, when configurable or selectable encoding and/or compression options were used when compressing compressed input data 432, command 430 may include (e.g., in specified bits, etc.) indications of how the options were configured or selected. In some embodiments, command 430 also includes or identifies information to be used by decoder subsystem 304 and/or decompressor subsystem 306 for decoding and/or decompressing compressed input data 432. For example, in some embodiments, command 430 includes (e.g., is included in a packet or message with) dictionary code mappings that are used for initializing a decompression reference such as a table, etc. in decompressor subsystem 306. In some embodiments, command header decoder 428 communicates information from or associated with command 430 (e.g., the dictionary code mappings, etc.) to decompressor subsystem 306.

Upon receiving command 430, in some embodiments, command header decoder 428 communicates, to read manager (MGR) 406 in decoder 400, which is the first/initial decoder to be started on decoding a stream from compressed input data 432, an address or location in the memory where a first stream from among the N streams in compressed input data 432 starts (e.g., stream 102 in compressed data 100). Using the address or location in the memory, read manager 406 starts fetching the first stream in compressed input data 432 from the memory. When the first stream begins to be returned from the memory, read manager 406 forwards an initial portion to buffer 416 (i.e., stores a specified number of bytes from the first stream in memory elements in buffer 416). Stream header decoder 414 acquires at least some of the initial portion of the first stream from buffer 416 and processes information from a header for the first stream that is included in the initial portion (e.g., header 108 from stream 102). Among the information from the header of the first stream is a length of the first stream, which stream header decoder 406 acquires and sends to command header decoder 428. Command header decoder 428, based on the length of the first stream, computes or determines an address or location in memory for a second stream from among the N streams in compressed input data 432 (e.g., stream 104) and communicates, to a read manager in decoder 402, which is the second decoder to be started on decoding a stream from compressed input data 432, an address or location in the memory where the second stream in the compressed input data starts. Decoder 402 then starts decoding the second stream using similar operations to those performed by decoder 400. In this way, command header decoder 404 starts decoders 400-404 in a cascading or daisy-chained fashion, with each decoder after the first decoder being started based on information acquired by command header decoder 428 from the prior decoder. In some embodiments, decoders 400-404 decode the respective stream "substantially in parallel," but not entirely in parallel, due to the offset in starting times of each of decoders 400-404 while the lengths of each of the N streams are determined.

In some embodiments, unlike the example above in which the header of each stream includes length information that is used to determine the starting location of the next stream in the compressed data, a header of a first stream of the N streams (or a header of the compressed data generally) includes length and/or starting location information for all N streams. In these embodiments, command header decoder 428 acquires the lengths and/or starting location information for all of the streams from the header of the first stream (or the header of the compressed data generally) and may start all remaining decoders (i.e., decoders 402-404) (or start all decoders) at approximately the same time using the respective length and/or starting location information acquired from the header of the first stream (or the header of the compressed data).

In some embodiments, stream header decoder 414 also acquires, from stream header information and/or metadata in the initial portion of the first stream (e.g., header 108 and/or metadata 110), information about configurations and/or settings used for encoding and/or compressing the first stream. For example, in some embodiments, stream header decoder 414 acquires information about the format or arrangement of data in the first stream (which may not be the same format or arrangement as the data in the other streams in compressed input data 432). Stream header decoder 414 then communicates the information about the configurations and/or settings to decompressor subsystem 306 for use therein, i.e., so that decompressor subsystem 306 can account for the configurations and/or settings when processing data from the first stream.

In some embodiments, decoding reference builder 424 in decoder 400 also acquires at least some of the initial portion of the first stream from buffer 416 and processes metadata for the first stream included in the initial portion (e.g., metadata 110) to acquire information for initializing and filling in decoding reference 426. For example, in some embodiments, the metadata in the first portion of the first stream includes mappings between codes and symbols (e.g., patterns of bits or bytes) to be used for the decoding the streams in each of substream decoders 408-412.

Along with forwarding the initial portion of the first stream to buffer 416, read manager 406 forwards respective portions of the first stream to buffers 418 and 420. From buffers 416-420, respective blocks or portions of data (e.g., 32 bit blocks of data per clock cycle, etc.) are fed into each corresponding substream decoder 408-412. Each of substream decoders 408-412, using information from decoding reference 426, decodes the received blocks or portions of data using corresponding decoding techniques to generate one or more symbols. In some embodiments, substream decoders 408-412 operate substantially in parallel when decoding the respective blocks or portions of data. For example, in some embodiments, each substream decoder decodes a respective block or portion of data every cycle of a controlling clock, and thus produces at least one decoded symbol (i.e., decoded data) for each cycle of the controlling clock. Each of substream decoders 408-412 then outputs the respective decoded data to stream combiner 422. Stream combiner 422 receives, from each of substream decoders 408-412, a stream of symbols and combines the streams of symbols from all of decoders 408-412 to generate the stream of decoded data output from decoder 400. For example, in some embodiments, stream combiner 422 acquires a next symbol from each of decoders 408-412 in a round-robin manner and appends the next symbol to an aggregate or combined stream of decoded data. Stream combiner 422, and, more broadly, decoder 400, then outputs the stream of decoded data to decompressor subsystem 306. In addition, each of decoders 402-404 (e.g., a stream combiner or another functional block therein) outputs respective streams of decoded data to decompressor subsystem 306 (as shown by the arrows from decoders 402-404 on the right side of FIG. 4).

In some embodiments, one or more of the decoders 402-404 is a secondary decoder that decodes secondary streams from among the N streams in the compressed input data. In contrast to primary streams, secondary streams are less complex to decode, and thus secondary decoders are simplified and may include less internal elements. For example, in some embodiments, secondary streams include information such as additional values and/or portions thereof for literals, command tags, lengths, and/or distances (of which remaining portions are included in primary streams) that are of fixed length (i.e., a fixed number of bits or bytes) and thus secondary streams may be decoded simply by retrieving chunks or blocks of data of the fixed length from the secondary stream.

In some embodiments, some or all of the streams include raw or unencoded stream data. For example, in some cases, encoding a stream causes the stream to become larger in size due to the effects of encoding and thus the stream is not encoded by an electronic device that compresses the original data. In some of these embodiments, some or all of buffers 416-420 can bypass the corresponding substream decoder (i.e., not perform decoding operations in the corresponding substream decoder) and communicate the raw or unencoded stream elements directly to stream combiner 422 and/or to decompressor subsystem 306.

FIG. 5 presents a block diagram illustrating decompressor subsystem 306 in accordance with some embodiments. Decompressor subsystem 306 includes internal elements for receiving decoded data output by decoder subsystem 304 and using the decoded data for generating commands for decompressing the compressed input data. Decompressor subsystem 306 also includes internal elements for executing the commands to recreate the original data from which the compressed input data was generated and storing recreated original data in a memory.

As can be seen in FIG. 5, the elements in decompressor subsystem 306 include command assembler 500, which is a functional block that performs operations for assembling (i.e., generating, creating, etc.) commands from information acquired from buffers 502-504, which are functional blocks that each buffer respective values such command tags, lengths, etc. used for assembling the commands. Decompressor subsystem 306 also includes operational combiner (OP COMB) 508, which is a functional block that performs operations for, when possible, combining commands (or the operations caused thereby) into new aggregate commands for subsequent execution in decompressor subsystem 306. Decompressor subsystem 306 further includes buffer 506 and literal buffer 510, which are functional blocks that perform operations for buffering literals in decoded data output by decoder subsystem 304 for use in decompressor subsystem 306. Decompressor subsystem 306 further includes read scheduler (SCH) 512 and read return (RETRN) 514, which are functional blocks that perform operations for acquiring, from memory, data (e.g., strings from recreated original data that were previously written to memory) to be used in recreating the original data when executing commands. Decompressor subsystem 306 further includes operational controller (OP CTRLR) 516 and command executer (CMD EXE) 518, which are functional blocks that control when commands are executed and execute commands, respectively. Decompressor subsystem 306 further includes operational (OP) cache 520 and history buffer 522, which are functional blocks that perform operations for caching commands and blocks of recreated original data (e.g., 32 byte blocks, etc.) to be used in executing commands and/or fed back to subsequent commands, as well as, for history buffer 522, from which recreated original data is written out to memory.

During operation of decompressor subsystem 306, decoded data is received by each of buffers 502-506 (e.g., command tags, lengths, and literals, respectively). The command tags and lengths are retrieved (e.g., in first-in-first-out order) from buffers 502-504 as needed by command assembler 500 and used by command assembler 500 to generate commands for recreating the original data. For example, based on a command tag alone (i.e., based on information or values included in the command tag), command assembler 500 may generate a command to acquire and add/append a next one or more literals to the recreated original data. As another example, based on a command tag in combination with a length and/or distance, command assembler 500 may generate a command to acquire a chunk or block of data of a specified size (e.g., number of bits or bytes) from an identified location in previously recreated original data and add/append the acquired chunk or block of data to the recreated original data. Note that, in some embodiments, there are two or more command assemblers (as shown by the additional block behind command assembler 500), and the command assemblers operate substantially in parallel for generating commands as described above.

From command assembler 500, generated commands are forwarded to operational combiner 506, which collects groups of two or more separate commands and attempts to combine the two or more commands into one or more aggregate commands. Each aggregate command performs all of the operations of two or more separate commands, but may do so with less computational effort (from command executer 518), less memory and/or cache memory accesses, etc. In some embodiments, when aggregate commands cannot be generated from two or more commands, the two or more commands themselves are separately output from operational combiner 506.

The commands or aggregate commands (collectively called "commands" for the remainder of this example for brevity and clarity) are forwarded from operational combiner 506 to read scheduler 512. Read scheduler 512 analyzes the commands to determine whether memory accesses are needed for acquiring chunks or blocks of data from recreated data that has already been written to memory. For example, if a command is to copy a chunk or block of data from previously-recreated original data to be used for executing a current command. When a memory read is to be performed to acquire blocks or chunks of data, read scheduler 512 sends, to memory, read requests for blocks and chunks of data.

From read scheduler 512, commands are passed to operational controller 516 which determines whether the commands can be executed or the commands are to be held to await the return of data from memory. When commands can be executed, operational controller 516 forwards the commands to command executer 518 for execution—or stores the commands in operational cache 520 and causes command executer 518 to acquire the commands from operational cache 520 for execution. Otherwise, when commands are to be held awaiting the return of data from memory, operational controller 516 forwards the commands to operational cache 520 to be stored while awaiting the return of the data. When data subsequently returns, read return 514 forwards the data to operational controller 516, which stores the data in operational cache 520 and causes command executer 518 to acquire the command and the data from operational cache 520 for execution.

Executing a command causes command executer 518 to perform the operations indicated by the command. For example, in some embodiments, a command is to add/append one or more literals to the end of recreated original data and thus command executer 518 acquires the one or more literals from literal buffer 510 (or operational cache 520 or history buffer 522) and adds/appends the one or more literals to the end of the recreated original data. In other words, command executer 518 outputs, to operational cache 520, the data (e.g., bits or bytes) of the literals acquired from literal buffer 510 in order, and the data of the literals is eventually written from operational cache 520 to a file in memory, a stream, etc. of the recreated original data. As another example, in some embodiments, a given command is to acquire a string of a length from a distance back in the already-recreated original data and add/append the string to the end of the recreated original data and thus command executer 518 performs a memory access to acquire the string from the already-recreated original data. Due to the earlier fetching of the string from memory by read scheduler 512, the memory access should hit in operational cache 520 (or history buffer 522, as described below) and command executer 518 acquires the string and adds/appends the string to the end of the recreated original data.

In some embodiments, history buffer 522 is used for temporarily storing and feeding back recently output data (e.g., literals and strings) output by command executer 518. In these embodiments, as a chunk of data (e.g., a T-bit literal, a K-bit or -byte string) is output from command executer 518, the chunk of data is written in the history buffer (perhaps via operational cache 520) in first-in-first-out order. Chunks of data are held in history buffer 522 for a given amount of time or until history buffer 522 is full, and then are written out to memory in first-in-first-out order. As described above, while resident in history buffer 522, chunks of data are available for feedback to subsequent commands.

Although FIG. 3 shows only one decompression engine in decompression subsystem 208, in some embodiments, decompression subsystem 208 includes multiple decompression engines. In these embodiments, the multiple decompression engines may be used (e.g., substantially in parallel) for decompressing portions of compressed input data or may be used for decompressing different/separate compressed input data. For example, in some embodiments, each of the multiple decompression engines may be used for decompressing a respective fraction or section of the same compressed input data.

Although FIG. 4 shows three decoders 400-404, in some embodiments, a different number of decoders is used. In addition, in some embodiments, there are a different numbers of other internal elements in decompression engine such as command assembler 500, command executer 518, etc. Also, in some embodiments, a different number of substream decoders and buffers are used in decoder subsystem 304 and decompressor subsystem 306. This is shown in FIGS. 4-5 via ellipses between the substream decoders and the buffers. Generally, in the described embodiments, the decompression engine includes sufficient internal elements to perform the operations described herein.

Processes for Decompressing Compressed Input Data

Figure 6:
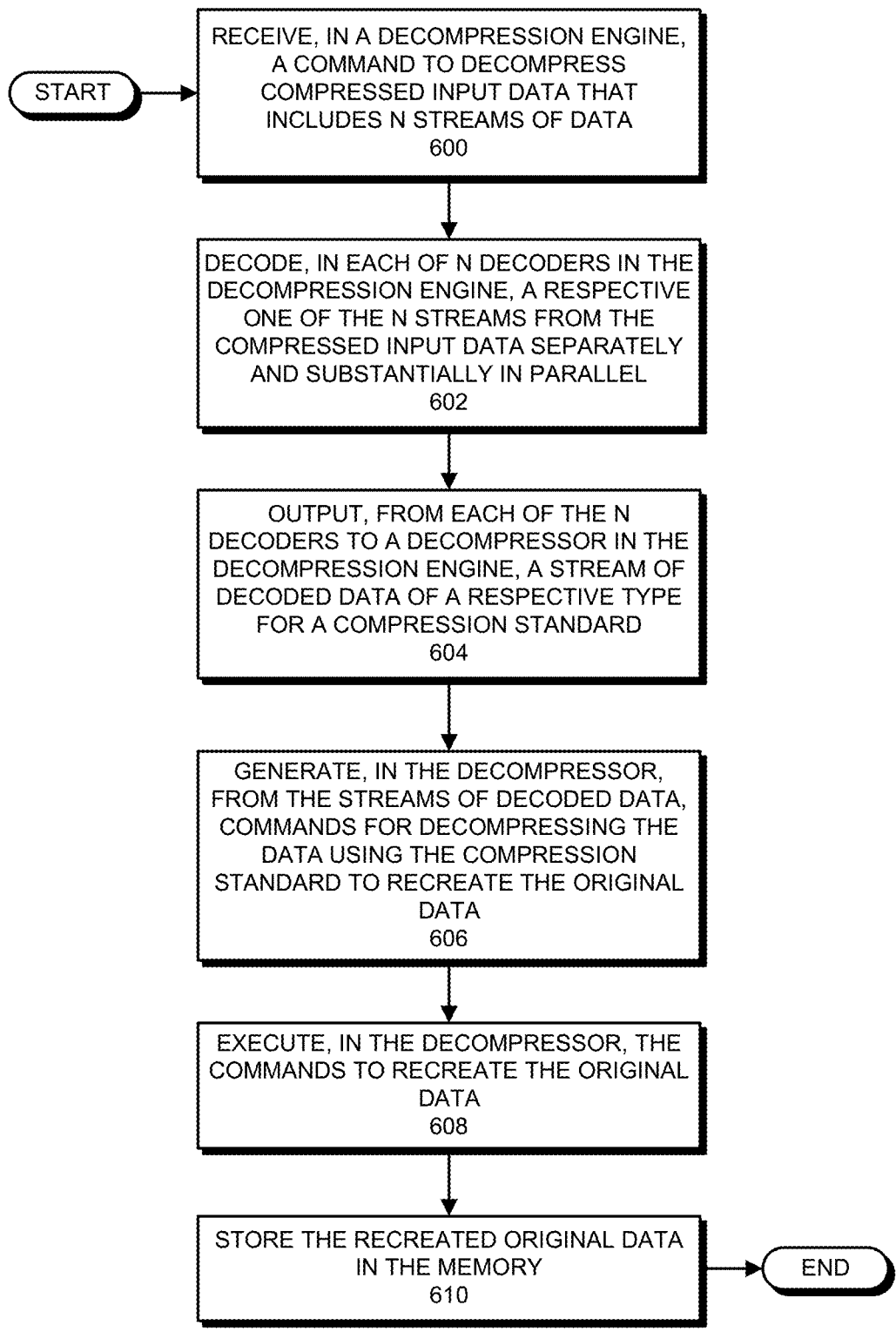
FIG. 6 presents a flowchart illustrating a process for decompressing compressed input data that includes multiple streams in accordance with some embodiments.

In the described embodiments, a decompression engine (e.g., decompression engine 300) that includes a decoder subsystem and a decompressor subsystem (e.g., decoder subsystem 304 and decompressor subsystem 306) performs operations for decompressing compressed input data that includes one or more separate streams of data (e.g., streams 102-106 in compressed data 100). FIG. 6 presents a flowchart illustrating a process for decompressing compressed input data that includes multiple streams in accordance with some embodiments. Note that the operations shown in FIG. 6 are presented as a general example of operations performed by some embodiments. The operations performed by other embodiments include different operations, operations that are performed in a different order, and/or operations that are performed by different entities or functional blocks.

For the example in FIG. 6, the compressed input data is assumed to have been compressed using a combination of dictionary coding compression (e.g., using an LZ77- or LZ78-based compression standard) and prefix coding (e.g., using a Huffman coding standard). This is not, however, a requirement. For example, in some embodiments, the data is first encoded, then separated into streams, and finally compressed, which is opposite to the example in FIG. 6. Generally, the described embodiments are operable with any combination of compression(s) and/or encoding(s) that can be decompressed using a decompression engine as is described herein. In addition, during the compression process, e.g., following or during the compression and before the encoding, the compressed data is assumed to have been separated into N streams of data. As described herein, each stream of the N streams of data includes—and may only include—data of a respective type for generating commands associated with the compression standard for decompressing the compressed input data. For example, in some embodiments, the types of data include some or all of literals, command tags, distances, lengths, and/or other data associated with the dictionary coding compression standard, and thus each of the N streams includes at least one—and possibly only one—of these types of data.

As can be seen in FIG. 6, the process starts when the decompression engine receives a command to decompress compressed input data that includes N streams of data (step 600). For this operation, the decompression engine receives, via a signal line, bus, or other communication interface, a packet, message, or signal that includes an identification of the command and/or the compressed input data. For example, in some embodiments, the identification of the command includes one or more bits or bytes organized in a pattern that identifies the command. As another example, in some embodiments, the identification of the compressed input data includes a location from where the compressed input data is to be acquired such as an address in memory, an identifier for a network interface device, etc.

The decompression engine then causes each of N decoders (e.g., decoders 408-412) in the decompression engine to decode a respective one of the N streams from the compressed input data separately and substantially in parallel (step 602). This operation involves the decompression engine (e.g., a command header decoder, a stream header decoder, etc.) determining a location in the compressed input data of each stream of the N streams and causing a different decoder from among the N decoders to commence decoding each stream. Decoding each stream includes each decoder (or another entity) performing lookups in a respective decoding reference (e.g., decoding reference 426) to determine symbols associated with blocks of encoded data in each stream and outputting the symbols.

The decoders each output, to a decompressor (e.g., decompressor subsystem 306) a stream of decoded data (i.e., the symbols) of the respective type for the compression standard (step 604). This operation involves the decoders outputting decoded data of a respective type for generating commands associated with the compression standard for decompressing the compressed input data. For example, one of the decoders may output decoded data that includes command tags, the command tags to be used alone or combined with other information output by one or more other decoders (e.g., lengths, distances, etc.) for generating commands for decompressing the compressed input data.

The decompressor then generates, from the streams of decoded data, commands for decompressing the data using the compression standard to recreate the original data (step 606). As described above, for this operation, the decompressor acquires chunks or portions of data (e.g., W-bit portions) from some or all of the streams and uses and/or combines the chunks or portions of data to create a command. For example, the decompressor may acquire a command tag from one of the streams of decoded data, the command tag identifying a copy command that will cause an executer (e.g., command executer 518) to add/append a previous string from earlier in the recreation of the original data to the end of the recreation of the original data. In this case, the decompressor also acquires a distance (e.g., a number of bytes back in the original data) from a second of the streams and/or a length (e.g., a number of bytes in the string) from a third of the streams to be combined with the command tag.

The decompressor then executes the commands to recreate the original data (step 608). As described above, this operation involves an executer (e.g., command executer 518) in the decompressor executing the command to generate and/or acquire strings and/or literals for adding/appending to the recreation of the original data. The decompressor then stores the recreated original data in the memory (step 610).

In some embodiments, at least one electronic device (e.g., electronic device 200) uses code and/or data stored on a non-transitory computer-readable storage medium to perform some or all of the operations herein described. More specifically, the at least one electronic device reads code and/or data from the computer-readable storage medium and executes the code and/or uses the data when performing the described operations. A computer-readable storage medium can be any device, medium, or combination thereof that stores code and/or data for use by an electronic device. For example, the computer-readable storage medium can include, but is not limited to, volatile and/or non-volatile memory, including flash memory, random access memory (e.g., eDRAM, RAM, SRAM, DRAM, DDR4 SDRAM, etc.), non-volatile RAM (e.g., phase change memory, ferroelectric random access memory, spin-transfer torque random access memory, magnetoresistive random access memory, etc.), read-only memory (ROM), and/or magnetic or optical storage mediums (e.g., disk drives, magnetic tape, CDs, DVDs, etc.).

In some embodiments, one or more hardware modules perform the operations herein described. For example, the hardware modules can include, but are not limited to, one or more processors/cores/central processing units (CPUs), application-specific integrated circuit (ASIC) chips, neural network processors or accelerators, field-programmable gate arrays (FPGAs), decompression engines, compute units, embedded processors, graphics processors (GPUs)/graphics cores, pipelines, accelerated processing units (APUs), functional blocks, controllers, accelerators, and/or other programmable-logic devices. When such hardware modules are activated, the hardware modules perform some or all of the operations. In some embodiments, the hardware modules include one or more general purpose circuits that are configured by executing instructions (program code, firmware, etc.) to perform the operations.

In some embodiments, a data structure representative of some or all of the structures and mechanisms described herein (e.g., electronic device 200 or some portion thereof) is stored on a non-transitory computer-readable storage medium that includes a database or other data structure which can be read by an electronic device and used, directly or indirectly, to fabricate hardware including the structures and mechanisms. For example, the data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates/circuit elements from a synthesis library that represent the functionality of the hardware including the above-described structures and mechanisms. The netlist may then be placed and routed to produce a data set describing geometric shapes to be applied to masks. The masks may then be used in various semiconductor fabrication steps to produce a semiconductor circuit or circuits (e.g., integrated circuits) corresponding to the above-described structures and mechanisms. Alternatively, the database on the computer accessible storage medium may be the netlist (with or without the synthesis library) or the data set, as desired, or Graphic Data System (GDS) II data.

In this description, variables or unspecified values (i.e., general descriptions of values without particular instances of the values) are represented by letters such as N, M, and X. As used herein, despite possibly using similar letters in different locations in this description, the variables and unspecified values in each case are not necessarily the same, i.e., there may be different variable amounts and values intended for some or all of the general variables and unspecified values. In other words, N and any other letters used to represent variables and unspecified values in this description are not necessarily related to one another.

The expression "et cetera" or "etc." as used herein is intended to present an and/or case, i.e., the equivalent of "at least one of" the elements in a list with which the etc. is associated. For example, in the statement "the electronic device performs a first operation, a second operation, etc.," the electronic device performs at least one of the first operation, the second operation, and other operations. In addition, the elements in a list associated with an etc. are merely examples from among a set of examples—and at least some of the examples may not appear in some embodiments.

The foregoing descriptions of embodiments have been presented only for purposes of illustration and description. They are not intended to be exhaustive or to limit the embodiments to the forms disclosed. Accordingly, many modifications and variations will be apparent to practitioners skilled in the art. Additionally, the above disclosure is not intended to limit the embodiments. The scope of the embodiments is defined by the appended claims.

What is claimed is:

1. An electronic device for decompressing compressed input data that includes N streams of data, the N streams of data having been generated from original data by compressing the original data using a compression standard to create compressed data, separating the compressed data into N streams, each of the N streams including a respective type of data for generating commands associated with the compression standard for decompressing the compressed input data, and encoding each of the N streams using an encoding standard, the electronic device comprising:
   a memory; and
   a decompression engine that includes N decoders and a decompressor, the decompression engine being configured to:
      receive a command to decompress the compressed input data;
      decode, in each of the N decoders, a respective one of the N streams from the compressed input data separately and substantially in parallel with others of the N decoder, each decoder outputting a stream of decoded data of a respective type for generating commands associated with the compression standard for decompressing the compressed input data;
      generate, in the decompressor, from the streams of decoded data output by the N decoders, commands for decompressing the compressed input data using the compression standard to recreate the original data;
      execute, in the decompressor, the commands to recreate the original data; and
      store, in the memory, the original data.

2. The electronic device of claim 1, wherein decoding the respective one of the N streams in each of one or more of the N decoders includes:
   acquiring, from a specified location in the respective one of the N streams, information for generating a decoding reference, the decoding reference including information that is used by that decoder for decoding a respective stream from the compressed input data.

3. The electronic device of claim 1, wherein at least one of the N decoders includes two or more sub stream decoders and a stream combiner, wherein:
   each of the two or more sub stream decoders is configured to:
      acquire a separate portion of data from a one of the N streams being decoded by the decoder in which that substream decoder is located;
      decode the separate portion of the data separately and substantially in parallel with others of the two or more substream decoders; and
      output a decoded data portion associated with the separate portion of the data; and
   the stream combiner is configured to:
      receive, from each substream decoder, the decoded data portion;
      combine the decoded data portions to generate the stream of decoded data; and
      output the stream of decoded data.

4. The electronic device of claim 1, wherein at least one of the N decoders is a secondary decoder in which simplified decoding operations are performed for decoding the respective one of the N streams.

5. The electronic device of claim 1, wherein the decompressor includes one or more buffers and at least one command assembler, wherein:
   each of the one or more buffers stores data from a separate one of the streams of decoded data output by the N decoders; and
   the command assembler:
      acquires data from the one or more buffers; and
      generates, from the data, the commands for decompressing the data.

6. The electronic device of claim 5, wherein the decompressor includes at least two command assemblers, wherein each command assembler is configured to:
   acquire a separate portion of data from the one or more buffers and directly from streams of decoded data output by the N decoders that are not stored in a buffer; and
   generate, from the separate portion of the data, commands, so that the at least two command assemblers each generate some of the commands for decompressing the data separately and substantially in parallel.

7. The electronic device of claim 5, wherein the decompressor includes an operation combiner configured to combine two or more commands into an aggregate command for decompressing the data.

8. The electronic device of claim 1, wherein the stream of decoded data output by the N decoders includes some or all of: literals, command tags, distances, and lengths.

9. The electronic device of claim 1, wherein the decompression engine includes a command header decoder, the command header decoder configured to:
    determine, by at least one of processing the command and communicating with stream header decoders in some or all of the N decoders, a starting location for each of the N streams in the compressed input data; and
    communicate, to each of the N decoders, the starting location of the respective one of the N streams in the compressed input data.

10. The electronic device of claim 1, wherein, when executing the commands to recreate the original data in the decompressor, the decompressor is configured to:
    when data in memory is used for executing a command, prefetch the data from memory;
    buffer the command while the data is prefetched from memory; and
    execute the command upon the data being returned from memory.

11. The electronic device of claim 1, wherein:
    the decompressor recreates the original data in chunks of a specified size and commands may have dependencies on data in chunks recreated by previous commands; and
    the decompressor stores a last M recreated chunks in a history buffer, the recreated chunks in the history buffer being available to be fed back to subsequent commands and the recreated chunks being written from the history buffer to the memory in a first-in-first-out order.

12. The electronic device of claim 1, wherein the encoding standard is a prefix coding standard and the compression standard is a dictionary coding compression standard.

13. A method for decompressing compressed input data that includes N streams of data in an electronic device that includes a memory and a decompression engine with N decoders and a decompressor, the N streams of data having been generated from original data by compressing the original data using a compression standard to create compressed data, separating the compressed data into N streams, each of the N streams including a respective type of data for generating commands associated with the compression standard for decompressing the compressed input data, and encoding each of the N streams using an encoding standard, the method comprising:
    receiving, by the decompression engine, a command to decompress the compressed input data;
    decoding, in each of the N decoders, a respective one of the N streams from the compressed input data separately and substantially in parallel with others of the N decoders, each decoder outputting a stream of decoded data of a respective type for generating commands associated with the compression standard for decompressing the compressed input data;
    generating, in the decompressor, from the streams of decoded data output by the N decoders, commands for decompressing the compressed input data using the compression standard to recreate the original data;
    executing, in the decompressor, the commands to recreate the original data; and
    storing, in the memory, the original data.

14. The method of claim 13, wherein decoding the respective one of the N streams in each of one or more of the N decoders includes:
    acquiring, from a specified location in the respective one of the N streams, information for generating a decoding reference, the decoding reference including information that is used by that decoder for decoding a respective stream from the compressed input data.

15. The method of claim 13, wherein at least one of the N decoders includes two or more sub stream decoders and a stream combiner, and wherein the method further comprises:
    acquiring, by each of the two or more sub stream decoders, a separate portion of data from a one of the N streams being decoded by the decoder in which that substream decoder is located;
    decoding, by each of the two or more substream decoders, the separate portion of the data separately and substantially in parallel with others of the two or more substream decoders;
    outputting, by each of the two or more substream decoders, a decoded data portion associated with the separate portion of the data;
    receiving, by the stream combiner, from each of the two or more sub stream decoders, the decoded data portion;
    combining, by the stream combiner, the decoded data portions to generate the stream of decoded data; and
    outputting, by the stream combiner, the stream of decoded data.

16. The method of claim 13, wherein at least one of the N decoders is a secondary decoder in which simplified decoding operations are performed for decoding the respective one of the N streams.

17. The method of claim 13, wherein the decompressor includes one or more buffers and at least one command assembler, wherein the method further comprises:
    storing, by each of the one or more buffers, data from a separate one of the streams of decoded data output by the N decoders;
    acquiring, by the command assembler, data from the one or more buffers; and
    generating, by the command assembler, from the data, the commands for decompressing the data.

18. The method of claim 17, wherein the decompressor includes an operation combiner and the method further comprises:
    combining, by the operation combiner, two or more commands into an aggregate command for decompressing the data.

19. The method of claim 13, wherein the stream of decoded data output by the N decoders includes some or all of: literals, command tags, distances, and lengths.

20. The method of claim 13, wherein the decompression engine includes a command header decoder, and the method further comprises:
    determining, by the command header decoder, by at least one of processing the command and communicating with stream header decoders in some or all of the N decoders, a starting location for each of the N streams in the compressed input data; and
    communicating, by the command header decoder, to each of the N decoders, the starting location of the respective one of the N streams in the compressed input data.

21. The method of claim 13, wherein executing the commands to recreate the original data in the decompressor comprises:
    when data in memory is used for executing a command, prefetching, by the decompressor, the data from memory;
    buffering, by the decompressor, the command while the data is prefetched from memory; and
    executing, by the decompressor, the command upon the data being returned from memory.

22. The method of claim 13, wherein the decompressor recreates the original data in chunks of a specified size and commands may have dependencies on data in chunks recreated by previous commands, and the method further comprises:

storing, by the decompressor, a last M recreated chunks in a history buffer, the recreated chunks in the history buffer being available to be fed back to subsequent commands and the recreated chunks being written from the history buffer to the memory in a first-in-first-out order.

23. The method of claim 13, wherein the encoding standard is a prefix coding standard and the compression standard is a dictionary coding compression standard.

* * * * *